United States Patent
Topping (10) Patent No.: US 9,899,551 B2
(45) Date of Patent: Feb. 20, 2018

(54) OPTOELECTRONIC DEVICE AND METHOD OF PRODUCING THE SAME

(71) Applicant: BIG SOLAR LIMITED, Sunderland (GB)

(72) Inventor: Alexander John Topping, Abington (GB)

(73) Assignee: Big Solar Limited, Sunderland (GB)

( * ) Notice: Subject to any disclaimer, the term of this patent is extended or adjusted under 35 U.S.C. 154(b) by 0 days.

(21) Appl. No.: 14/764,599

(22) PCT Filed: Jan. 30, 2014

(86) PCT No.: PCT/GB2014/050251
§ 371 (c)(1),
(2) Date: Jul. 30, 2015

(87) PCT Pub. No.: WO2014/118545
PCT Pub. Date: Aug. 7, 2014

(65) Prior Publication Data
US 2015/0372176 A1    Dec. 24, 2015

(30) Foreign Application Priority Data

Jan. 30, 2013  (GB) .................................. 1301683.7

(51) Int. Cl.
*H01L 31/00* (2006.01)
*H01L 31/047* (2014.01)
(Continued)

(52) U.S. Cl.
CPC .... *H01L 31/047* (2014.12); *H01L 31/035281* (2013.01); *H01L 31/0504* (2013.01); *H01L 31/18* (2013.01); *Y02E 10/50* (2013.01)

(58) Field of Classification Search
CPC .......... H01L 31/047; H01L 31/035281; H01L 31/046
(Continued)

(56) References Cited

U.S. PATENT DOCUMENTS 4,335,503 A    6/1982  Evans, Jr. et al.
5,067,985 A   11/1991  Carver et al.
(Continued)

FOREIGN PATENT DOCUMENTS

DE    19937724       12/2000
JP    56135573 A      2/1986
(Continued)

OTHER PUBLICATIONS

English Translation of Office Action dated Jun. 21, 2016, issued in Japanese Application No. 2015-555797, 3 pages.
(Continued)

*Primary Examiner* — Niki Bakhtiari
(74) *Attorney, Agent, or Firm* — Meunier Carlin & Curfman LLC (57) ABSTRACT

An optoelectronic device comprising a substrate having a first and a second series of grooves and a channel therebetween. Each groove of the first and second series of grooves has a first and a second face and a cavity therebetween. The cavity is at least partially filled with a first semiconductor material. The first face is coated with a conductor material and the second face coated with a second semiconductor material. The channel transects the grooves of the first and second series of grooves. Also a method of producing an optoelectronic device.

17 Claims, 6 Drawing Sheets

(51) Int. Cl.
*H01L 31/0352* (2006.01)
*H01L 31/05* (2014.01)
*H01L 31/18* (2006.01)

(58) Field of Classification Search
USPC .............................................. 136/243–265
See application file for complete search history.

(56) References Cited

U.S. PATENT DOCUMENTS

| | | | |
|---|---|---|---|
| 5,689,358 A | | 11/1997 | Nakao et al. |
| 6,084,175 A | * | 7/2000 | Perry ................ H01L 31/02242 136/256 |
| 2010/0244056 A1 | | 9/2010 | Ray et al. |
| 2010/0294536 A1 | | 11/2010 | Usami |

FOREIGN PATENT DOCUMENTS

| | | |
|---|---|---|
| JP | 2010529599 A | 8/2010 |
| JP | 2012049542 A | 3/2012 |
| WO | 02059981 | 8/2002 |
| WO | 2011034908 A1 | 3/2011 |
| WO | 2012175902 | 12/2012 |

OTHER PUBLICATIONS

International Search Report and Written Opinion of International Application No. PCT/GB2014/050251, dated May 9, 2014, 8 pages.
Combined Search and Examination report dated May 16, 2013 for GB application 1301683.7.

\* cited by examiner

OPTOELECTRONIC DEVICE AND METHOD OF PRODUCING THE SAME

The present invention relates to an optoelectronic device and more specifically a solar photovoltaic cell.

The term photovoltaic refers to the production of electricity, normally direct electrical current, from light at the junction between two materials that are exposed to the light. The light is normally sunlight and therefore photovoltaic is often referred to as solar photovoltaic. It is known to use semiconductors for the two materials. The semiconductor materials used exhibit a photovoltaic effect.

The two materials are usually semiconductors, a p-type and an n-type semiconductor material. When joined together the boundary or interface between the two types of semiconductor material is referred to as a p-n junction. This type of p-n junction is usually created by doping one material with the other material. The doping may be by diffusion, ion implantation or epitaxy. The later involves growing a second layer of crystal doped with one type of dopant on top of a first layer of crystal doped with a different type of dopant.

The p-n junction can be found in most optoelectronic devices that use semiconductors. These optoelectronic devices include photovoltaic or solar photovoltaic cells, diodes, light-emitting diodes (LEDs) and transistors. The p-n junction can be thought of as the active site where the generation or consumption of electrical energy occurs.

The demand for sources of renewable energy has driven significant improvements in the cost and efficiency of solar photovoltaic cells but existing technology still represents a relatively expensive method of generating electricity. Also, existing solar photovoltaic cells are relatively inefficient compared to other methods of generating electricity and are relatively fragile, that is they are relatively easily damaged.

The present invention aims to mitigate one or more of the disadvantages of existing solar photovoltaic cells.

In accordance with a first aspect of the present invention there is provided an optoelectronic device comprising:
- a substrate comprising a first and a second series of grooves and a channel therebetween;
- each groove of the first and second series of grooves having a first and a second face and a cavity therebetween;
- the cavity at least partially filled with a first semiconductor material;
- the first face coated with a conductor material and the second face coated with a second semiconductor material; and
- wherein the channel also transects the grooves of the first and second series of grooves.

It may be an advantage of the present invention that the channel separates the first and second series of grooves such that an electrical current can be taken from or supplied to the first series of grooves in isolation from the second series of grooves.

The first and second series of grooves are typically elongate grooves. The channel between the first and second series of grooves is typically an elongate channel.

The channel typically transects the grooves of the first and second series of grooves at or toward an end of each groove. The channel typically transects or crosses the grooves of the first series of grooves toward an end of each groove and then passes between the first and second series of grooves before transecting or crossing the grooves of the second series of grooves toward an opposite and/or opposing end of each groove.

The first and second faces of each of the grooves of the first and second series of grooves may be coated with the conductor material. The first and second faces of each of the grooves of the first and second series of grooves may be coated with the second semiconductor material.

The second face may be coated with the second semiconductor material and the first face coated with a third semiconductor material. The first semiconductor material at least partially filling the cavity may be an intrinsic semiconductor.

The first and second faces of each of the grooves of the first and second series of grooves may be referred to as the integral first and integral second faces respectively. The integral first face is normally at a first angle relative to a normal from the substrate and the integral second face at a second angle relative to a normal from the substrate. The first angle is normally from 45 to less than 90°. The second angle is normally from 45 to less than 90°.

The first semiconductor material is typically a p-type semiconductor material. The second semiconductor material is typically an n-type semiconductor material. The p-type semiconductor is therefore normally in the cavity of the grooves.

In an alternative embodiment the first semiconductor material is an n-type semiconductor material and the second semiconductor material is a p-type semiconductor material.

The n-type and p-type semiconductors may comprise one or more of silicon, amorphous silicon, hydrogenated amorphous silicon, aluminium, germanium, gallium nitride, gallium arsenide, aluminium phosphide, aluminium arsenide, copper iodide, zinc oxide and any other semiconductor.

The n-type semiconductor typically comprises one or more of silicon, germanium, phosphorus, selenium, tellurium and cadmium sulphide.

The p-type semiconductor typically comprises one or more of silicon, germanium, cadmium telluride, copper indium gallium selenide ('CIGS'), copper indium gallium diselenide, copper oxide, boron, beryllium, zinc and cadmium.

The first and second semiconductor materials may meet at an interface and/or boundary. The interface is typically referred to as a p-n junction. The first and second semiconductor materials may together be referred to as an active material.

The active material may be deposited in the cavity and on the first and/or second face of the cavity and may provide ohmic and rectifying contacts for insertion or extraction of charge from the active material. The active material may be one or more of photovoltaic, light emitting and ion conducting.

The second face may be coated with a conductor material and the second semiconductor material. The conductor material coated on the first face may be the same as the conductor material coated on the second face but it may be different. The conductor material coated on the first and/or second face may comprise one or more of aluminium, bismuth, cadmium, chromium, copper, gallium, gold, indium, lead, magnesium, manganese, samarium, scandium, silver, tin and zinc.

The second semiconductor material may be an electron blocking material such as molybdenum trioxide. The first semiconductor material may be a heterojunction, that is a mixture of one or more of a p-type semiconductor, n-type semiconductor and donor acceptor material.

Typically a portion, normally a substantial portion, of the first and second series of grooves and channel therebetween are substantially parallel, typically parallel to one another.

The channel may extend across the first and second series of grooves and typically across the end of the first and second series of grooves. The channel may extend across the first and second series of grooves and typically across opposing ends of the first and second series of grooves.

The channel may extend both perpendicular to and parallel to the first and second series of grooves. Normally the channel is perpendicular to the first and second series of grooves when it extends across the ends of the first and second series of grooves. Normally the channel is parallel to the first and second series of grooves when it extends between the first and second series of grooves. The angle at which the channel may extend across the ends of the first and second series of grooves can be variable and optionally be from 0 to 90°, normally from 35 to 55° and typically be 45°.

When the channel extends both perpendicular to and parallel to the first and second series of grooves, the channel may be referred to as running in at least two directions to connect said first and second series of grooves.

When the channel extends substantially perpendicular and across the ends of the first and second series of grooves, it may also extend in at least two directions relative to the first and second series of grooves. When the channel extends in at least two directions relative to the first and second series of grooves it typically forms a zigzag shape.

A surface of the substrate comprising the first and second series of grooves and a channel therebetween may be referred to as a structured surface. The structured surface is typically not flat. The substrate may have another surface that is flat.

The channel may be referred to as a delineation feature. The channel typically separates the first and second series of grooves. The channel typically has a first and a second face and a channel cavity therebetween. At least the first face of the channel may be coated with the conductor material and the second face of the channel may be coated with the second semiconductor material. The second face of the channel may also be coated with the conductor material. The channel cavity between the first and second faces of the channel is normally at least partially filled with the first semiconductor material.

The channel typically has a first face at a first angle relative to a normal from the substrate and a second face at a second angle relative to a normal from the substrate. The first face of the channel and the second face of the channel may be perpendicular to the plane of the substrate. The first angle is normally from 45 to less than 90°. The second angle is normally from 45 to less than 90°.

The first semiconductor material in the cavity, second semiconductor material on the second face and conductor material on at least the first face of each groove of the first and second series of grooves are normally all in electrical communication. The electrical communication is such that normally an electrical current can flow between the first and second semiconductor materials and the conductor material.

There is usually no electrical communication between the first semiconductor material in the channel cavity, second semiconductor material on the second face and conductor material on at least the first face of the channel.

The depth of the first semiconductor material in the cavity between the first and second faces of each of the first and second series of grooves is substantially the same or at least similar to the depth of the first semiconductor material in the channel cavity between the first and second faces of the channel.

A first side and a second side of the channel may provide the positive and negative poles of an electrical circuit. The first and second sides may be in electrical communication with the conductor material on the first and second faces of the channel. The first side of the channel may be in electrical communication, typically attached to, the positive pole of the electrical circuit. The second side of the channel may be in electrical communication, typically attached to, the negative pole of the electrical circuit.

Electricity in the electrical circuit may have one or more of a current of from 1 milliamp to 1 amp, a potential of from 0.1 to 3 volts and power of from $1 \times 10^{-6}$ to 3 watts.

The first and second sides of the channel may be adjacent to the channel. The first and second sides of the channel may be at least substantially parallel to the plane of the substrate.

The channel is typically non-conductive. The channel typically separates and/or insulates the first and second sides of the channel from one another.

The optoelectronic device may be referred to as a two terminal device. The first and second series of grooves may be referred to as cascaded groove structures. In use the device may be fabricated in a series arrangement and operated in a parallel or a combined series and parallel arrangement.

The cavity between the first and second faces of the first and second series of grooves may be any shape and is normally U-shaped, V-shaped or semi-spherical. The cavity between the first and second faces of the first and second series of grooves may have a flat bottom. The channel cavity between the first and second faces of the channel may be any shape and is normally U-shaped, V-shaped or semi-spherical. The channel cavity between the first and second faces of the channel may have a flat bottom. The shape of the cavity between the first and second faces of the first and second series of grooves may be the same or different to the shape of the channel cavity between the first and second faces of the channel.

The bottom of the channel cavity may be flat or may be rutted. The rutted bottom of the channel cavity may be referred to as uneven or rough. The rutted bottom of the channel cavity typically increases the surface area of the bottom of the channel cavity.

Increasing the surface area of the bottom of the channel cavity may help to ensure the channel separates and/or insulates the first and second sides of the channel from one another.

The channel and grooves of the first and second series of grooves typically have a depth measured from an upper surface of the substrate to a point in the channel or groove furthest from the upper surface.

The depth of the channel is typically greater than the depth of the grooves of the first and second series of grooves. The depth of the channel may be at least twice the depth of the grooves of the first and second series of grooves.

The channel has a depth and a width. The depth of the channel is typically twice the width of the channel. The aspect ratio for the depth to the width of the channel is therefore typically 2:1.

The first and second series of grooves typically form a series of ridges and cavities. The first and second series of grooves may comprise from 2 to 500 cavities.

The inventor of the present invention has appreciated that, in contrast to the usual trend towards reducing the cost and increasing the efficiency of optoelectronic devices, if the costs are significantly reduced, may be by up to an order of magnitude, then the efficiency is less important. When the optoelectronic device is a solar photovoltaic cell, this is particularly useful if the durability of the solar photovoltaic cells can be improved so that installation is relatively easy and therefore low cost and the solar photovoltaic cells have a greater range of application.

The optoelectronic device according to the first aspect of the present invention may be one or more of attached, secured and applied to a vehicle, for example a car or lorry, a house, for example a roof, and any other surface of a permanent structure. The permanent structure may be man-made or natural.

A surface that the optoelectronic device is one or more of attached, secured and applied to may be flat or uneven, that is one or more of rough, bumpy, irregular and/or rutted. The surface may be part of a building including a house and/or a domestic roof.

Each of the grooves of the first and second series of grooves is typically from 5 to 200 mm long, normally from 5 to 1000 mm long. Each of the grooves of the first and second series of grooves is typically from 0.1 to 100 µm wide, normally from 0.3 to 5 µm wide.

The substrate may comprise a curable resin and in particular a UV curable resin. The substrate may comprise one or more of an acrylic resin coated onto polyvinyl chloride (PVC), acrylic resin coated onto polyethylene terephthalate (PET), acrylic resin coated onto polyethylene naphthalate (PEN), a biopolymer coated onto polyvinyl chloride (PVC), a biopolymer coated onto polyethylene terephthalate (PET) and a biopolymer coated onto polyethylene naphthalate (PEN).

The first and second series of cascaded groove structures may comprise the substrate.

In accordance with a second aspect of the present invention there is provided a method of producing an optoelectronic device, the method including the steps of:
  providing a substrate comprising a first and a second series of grooves and a channel therebetween, each groove of the first and second series of grooves having a first and a second face and a cavity therebetween, and wherein the channel also transects the grooves of the first and second series of grooves;
  coating at least the first face with a conductor material and coating the second face with a semiconductor material; and
  at least partially filling the cavity with another semiconductor material.

The semiconductor material coated on the second face may be referred to as a second semiconductor material. The another semiconductor material at least partially filling the cavity may be referred to as a first semiconductor material.

The step of coating the at least first face with the conductor material and coating the second face with the semiconductor material is normally before the step of at least partially filling the cavity with the another semiconductor material.

The channel typically has a first and a second face and a channel cavity therebetween.

The step of at least partially filling the cavity between the first and second faces of the grooves with the another semiconductor material also at least partially fills the channel cavity with the another semiconductor material.

The first and second semiconductor materials are typically different. The first semiconductor material is typically a p-type semiconductor material. The second semiconductor material is typically an n-type semiconductor material.

The step of coating at least the first face of each groove of the first and second series of grooves with the conductor material and coating the second face of each groove of the first and second series of grooves with the semiconductor material typically comprises an off-axis directional coating process. The step of at least partially filling the cavity of each groove with the another semiconductor material typically comprises one or more of an off-axis directional coating process, directional coating process and uniform coating process.

The first and second faces and cavity of each groove of the first and second series of grooves are normally configured to be coated by an off-axis directional coating process.

The method step of coating at least the first face of each groove of the first and second series of grooves with the conductor material is typically before the step of coating the second face of each groove of the first and second series of grooves with the semiconductor material. The method step of at least partially filling the cavity with the another semiconductor material typically follows these coating steps.

The off-axis directional coating process may include spraying the conductor material and/or the semiconductor material at an angle relative to the plane of the substrate, and therefore also each of the grooves of the first and second series of grooves, such that only the first or second face of each groove of the first and second series of grooves is coated. This is typically because the coating is substantially restricted by viewing angle to only one of the first or second face.

The off-axis directional coating process may include using a shield to restrict the coating of the conductor material and/or the semiconductor material onto the at least first and/or second face of each groove of the first and second series of grooves.

The off-axis directional coating process may be repeated using more than one conductor material and/or semiconductor material.

The step of providing the substrate typically includes patterning a surface of the substrate to produce a structured surface.

The optional features of the second aspect of the present invention can be incorporated into the first, third, fourth, fifth, sixth and/or seventh aspect of the present invention and vice versa.

In accordance with a third aspect of the present invention there is provided a method of producing a structured surface specifically designed to allow at least two terminal devices to be fabricated in a series arrangement but operated in a parallel or combined series and parallel arrangement, comprising the steps of: patterning a surface to produce a structured surface, wherein said structured surface comprises at least two series of cascaded groove structures and a delineation feature running in at least two directions to connect said cascaded groove structures, and using an off-axis directional coating process to define conductive surfaces on said cascaded groove structures and said delineation features.

The at least two terminal devices comprise solar cells, solar photovoltaic cells, organic light emitting devices and electrochemical cells.

The optional features of the third aspect of the present invention can be incorporated into the first, second, fourth, fifth, sixth and/or seventh aspect of the present invention and vice versa.

In accordance with a fourth aspect of the present invention there is provided a solar cell, organic light emitting device or electrochemical device produced according to the third aspect of the present invention.

The optional features of the fourth aspect of the present invention can be incorporated into the first, second, third, fifth, sixth and/or seventh aspect of the present invention and vice versa.

In accordance with a fifth aspect of the present invention there is provided a two terminal device comprising an active material between the two terminals of said device and further comprising a structured surface specifically designed to allow said device to be fabricated in a series arrangement but operated in a parallel or combined series and parallel arrangement, wherein said structured surface comprises at least two series of cascaded groove structures and delineation features running in at least two directions to connect said cascaded groove structures, and further wherein said cascaded groove structures and delineation features comprise conductive surfaces configured to be coated defined by an off-axis directional coating process.

The optional features of the fifth aspect of the present invention can be incorporated into the first, second, third, fourth, sixth and/or seventh aspect of the present invention and vice versa.

In accordance with a sixth aspect of the present invention there is provided a method of producing a structured surface specifically designed to allow at least two terminal devices to be fabricated in a series arrangement but operated in a parallel or combined series and parallel arrangement, comprising the steps of: patterning a surface to produce a structured surface, wherein said structured surface comprises at least two series of cascaded groove structures and a delineation feature running in at least two directions to said cascaded groove structures, and using an off-axis directional coating process to define conductive surfaces on said cascaded groove structures and said delineation features.

The at least two terminal devices may comprise solar photovoltaic cells, organic light emitting devices and electrochemical cells.

The at least two series of cascaded groove structures may have a substrate wherein each groove comprises at least one integral first face at a first angle relative to a normal from the substrate, at least one integral second face at a second angle relative to a normal from the substrate, with a cavity in the structure between the first and second faces.

An active material may be deposited in said cavity to provide ohmic and rectifying contacts for insertion or extraction of charge from the active material.

The active material may be photovoltaic, light emitting or ion conducting.

The photovoltaic active material may be selected from one or more of the following: cadmium telluride, copper indium gallium diselenide, copper oxide, amorphous silicon, hydrogenated amorphous silicon, germanium or other semiconductor. The photovoltaic active material may be an organic semiconductor.

The delineation feature may comprise a first face at a first angle relative to a normal from the substrate and a second face at a second angle relative to a normal from the substrate.

The first face and said second face may be perpendicular to the substrate.

The delineation feature may run parallel and perpendicular to the at least two series of cascaded groove structures.

The delineation feature may run parallel and at a variable angle to the at least two series of cascaded grooves.

The off-axis directional coating may sequentially coat with a conducting layer only one side of the cascaded groove structure or delineation feature.

The off-axis directional coating may coat a first side of said cascaded groove structure or said delineation feature with a first conducting layer and coat a second side of said cascaded groove structure or said delineation feature with a second conducting layer.

The off-axis directional coating may be performed from an angle such that the coating is substantially restricted by viewing angle to only one side of the cascaded groove structure or delineation feature.

The off-axis directional coating may further comprise a shield that restricts the coating on the cascaded groove structures and the delineation feature such that only one side of the cascaded groove structure or delineation feature is coated.

The off-axis directional coating may comprise one or a plurality of coating sources.

At least one of the conducting layers may be composed of or include one or more of the following: aluminium, bismuth, cadmium, chromium, copper, gallium, gold, indium, lead, magnesium, manganese, samarium, scandium, silver, tin and zinc.

The optional features of the sixth aspect of the present invention can be incorporated into the first, second, third, fourth, fifth and/or seventh aspect of the present invention and vice versa.

In accordance with a seventh aspect of the present invention there is provided a two terminal device comprising a structured surface specifically designed to allow said device to be fabricated in a series arrangement but operated in a parallel or combined series and parallel arrangement, wherein said structured surface comprises at least two series of cascaded groove structures and delineation features running in at least two directions to said cascaded groove structures, and further wherein said cascaded groove structures and delineation features comprise conductive surfaces defined by an off-axis directional coating process.

The said off-axis directional coating may be performed from an angle such that the coating is substantially restricted by viewing angle to only one side of the cascaded groove structures and delineation features.

The said device may be a solar cell, organic light emitting device or electrochemical device.

The optional features of the seventh aspect of the present invention can be incorporated into the first, second, third, fourth, fifth and/or sixth aspect of the present invention and vice versa.

An embodiment of the invention will now be described by way of example only and with reference to the accompanying drawings, in which:

FIG. 2 is a cross-sectional view of part of the optoelectronic device shown in FIG. 1a;

Figure 1A:
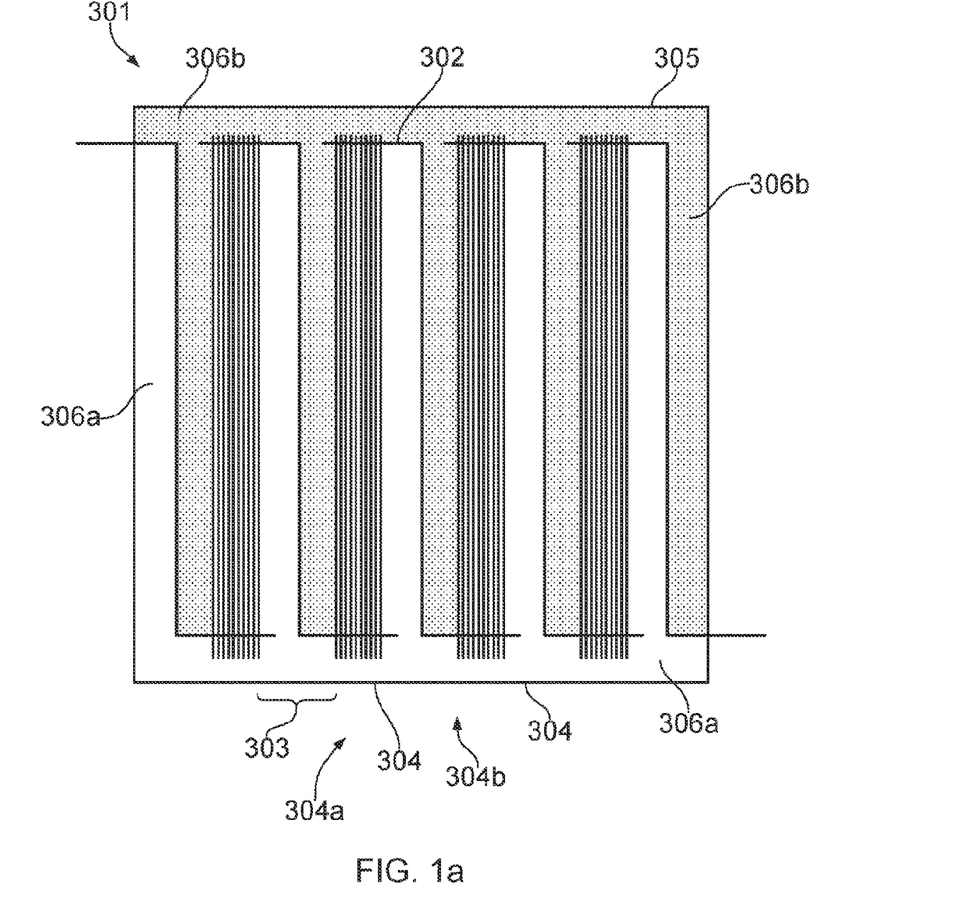
FIG. 1a is a plan view of an optoelectronic device of the present invention.

FIG. 1a shows a plan view of the optoelectronic device 301 comprising a substrate 305. The substrate 305 has a surface comprising a first 304a and a second 304b series of grooves and a channel 302 therebetween.

The optoelectronic device 301 is a solar photovoltaic cell. The optoelectronic device 301 includes a mixture of interdigitated (parallel connected) and cascaded (series connected) grooves 304. The operating voltage of the optoelectronic device 301 can be controlled by changing the number of series of grooves 304a & 304b. Increasing the number of series of grooves 304a & 304b increases the operating voltage of the optoelectronic device 301. The optoelectronic device 301 can be operated in parallel or a combination of series and parallel arrangement. It may be an advantage of the optoelectronic device 301 that this removes the need for extra process steps to be used to connect the cascaded groove structures in series to achieve the desired output voltage.

The channel 302 is a means to separate but also connect the cascaded (series connected) grooves 304a & 304b in parallel, in order to make it possible to extract the desired electric charge generated at the voltage designed by the number of cascaded groove structures 304a & 304b.

The channel 302, also referred to as the delineation or structural delineation feature first crosses the first series 304a of cascaded grooves toward the edge of the structured web and then crosses a space 303 between the cascaded grooves 304a & 304b, and subsequently crosses the second series of cascaded grooves 304b toward the opposite edge of the structured web. Since many of these structural delineation features 302 are used, each series of cascaded grooves, 304a & 304b for example, are crossed toward each edge by elements of two successive individual delineation features 302, as depicted in FIG. 1a.

The spaces 303 are divided into first 306a and second 306b areas. The first area 306a carries a positive charge and the second area 306b carries a negative charge 306b.

It may be an advantage that the optoelectronic device of the present invention does not suffer from the same sensitivity to defects in its structure compared to other known optoelectronic devices of the prior art. Any defect in the structure of a typical known planar sandwich construction solar photovoltaic cell for example will severely affect the overall performance of the cell into which the sandwich construction is incorporated. This means the fabrication processes must be kept very clean and any subsequent coating process must be highly uniform. These requirements reduce the process yields and throughputs as materials deposited in the sandwich construction must be very uniform and this requires the processing to be carefully controlled.

Furthermore, the typical known planar sandwich construction has a transparent conducting layer, which may be, for example, zinc oxide or indium oxide based, which is expensive. Also, any error made during the subsequent manufacturing processes to produce the desired voltage from the sandwich construction are therefore costly. The transparent conducting layer requires a high temperature for its deposition in order to achieve the required performance for commercial products, further increasing the cost of fabrication of the device.

The optoelectronic device of the present invention may mitigate some or all of the above disadvantages of known solar photovoltaic cells having a planar sandwich construction. The channel or delineation feature 302, is created with the grooves 304, before coating. Some known systems first produce the grooves, then coat the grooves before producing the delineation feature 302.

Figure 1B:
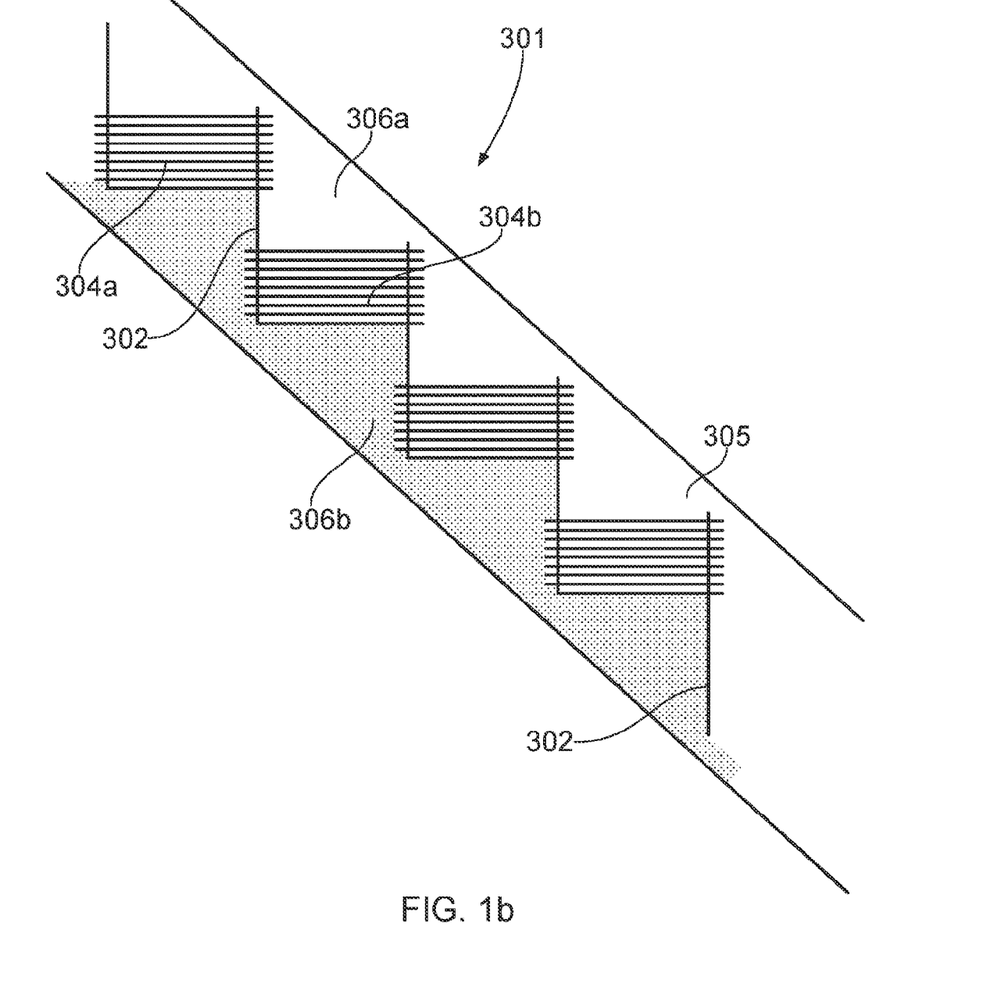
FIG. 1b is a plan view of an alternative optoelectronic device of the present invention.

FIG. 1b shows a plan view of an alternative optoelectronic device 301 comprising a substrate 305. The substrate 305 has a surface comprising a first 304a and a second 304b series of grooves and a channel 302 therebetween. Other features of the optoelectronic device 301 shown in FIG. 1b are the same as those shown in FIG. 1a.

FIG. 1b shows a straight channel 302 between an offset first 304a and second 304b series of grooves.

Figure 2:
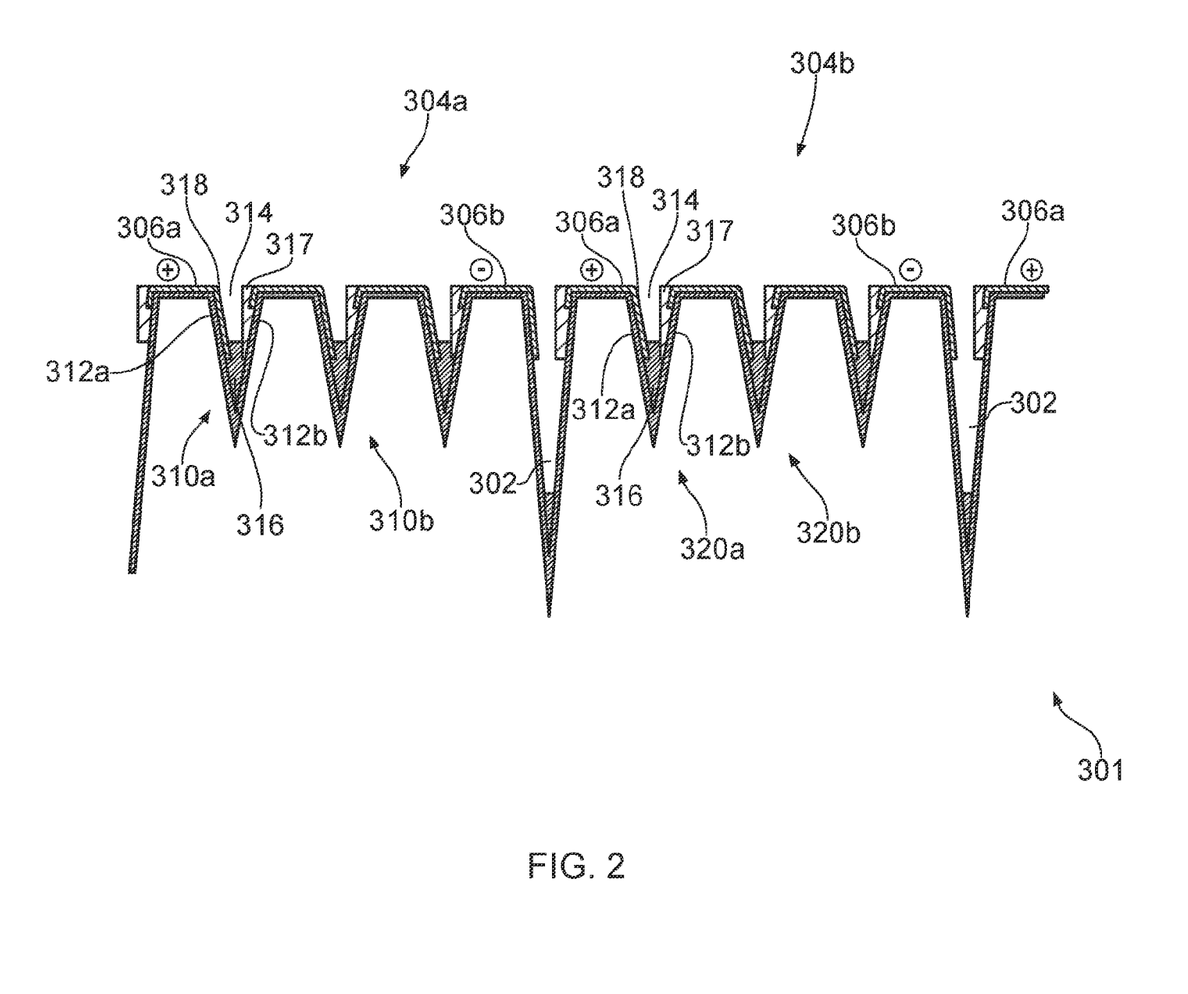

FIG. 2 shows a cross-sectional view of part of the optoelectronic device 301 shown in FIG. 1a.

Each groove 310a & 310b for example, of the first series of grooves 304a has a first face 312a and a second face 312b and a cavity 314 therebetween. Each groove 320a & 320b for example, of the second series of grooves 304b has a first face 312a and a second face 312b and a cavity 314 therebetween.

The channel 302 has a depth equal to twice the depth of the grooves 310a & 310b and 320a & 320b of the first 304a and second 304b series of grooves respectively.

The cavities 314 are partially filled with a first semiconductor material 316. The first face 312a is coated with a conductor material 318 and the second face 312b is coated with a second semiconductor material 317.

The first face 312a is coated with a conductor material 318 and the second face 312b is coated with a semiconductor material 317 using an off-axis coating technique. The cavity 314 is partially filled with the another semiconductor material using a uniform coating technique.

The off-axis directional coating requires that the coating occurs from an angle relative to each groove 310a & 310b for example, of the first series of grooves 304a and also each groove 320a & 320b for example, of the second series of grooves 304b. The coating is sprayed into the grooves and deposited from either side of a vertical axis. The off-axis directional coating is performed in a partial vacuum. The partial vacuum ensures the coating material from the source has a sufficient mean free path, that is a direct and un-diverted path, and that the substrate is substantially free from interactions with gas or atmospheric molecules.

Spray is used herein to refer to any type of directional coating of individual elements and/or droplets, the dimensions of which are smaller than the dimensions of each groove 310a & 310b for example, of the first series of grooves 304a and also each groove 320a & 320b for example, of the second series of grooves 304b The off-axis directional coating means that the coating of conductor material 318 and second semiconductor material 317 is substantially restricted by viewing angle to only one side of each groove 310a & 310b for example, of the first series of grooves 304a and one side of each groove 320a & 320b for example, of the second series of grooves 304b. The acceptable limits of off-axis directional coating are defined by the type of structure and/or substrate onto which the coating is deposited. The coating may be either continuous or discontinuous over a surface of the structure and/or substrate depending on its fine structure or the type of structure or substrate used.

The shape of the cavity 314 formed by and between the first and second faces 312a & 312b of the first 304a and second 304b series of grooves is such that the viewing angle is restricted. The restricted viewing angle is the result of the upper edges of the neighbouring groove.

The process of off-axis directional coating is further described in WO 2012/175902A1. The process of off-axis directional coating may be referred to as Glancing Angle Deposition (GLAD).

The conductor material 318 and second semiconductor material 317 are deposited on the cascaded groove structured surfaces 304a & 304b using off-axis directional coating, enabling the fabrication of non-contacting interdigitated conductors having defined geometries along the surface presented to the source of coating materials.

The second face 312b is often coated with a second conductor material (not shown) and then the semiconductor material 317. Both coats are applied using the off-axis coating technique. The semiconductor material 317 is then coated on top of the second conductor material (not shown). The conductor material 318 and second conductor material (not shown) are then used as connections, sometimes for input and output connections, to the first 316 and second 317 semiconductor materials deposited in the space between the conductor material 318 and second conductor material (not shown) on the structured surface, that is the surface of the substrate.

The off-axis directional coating coats both the grooves 304a & 304b and delineation feature 302 running parallel to one another and the portions 306a & 306b of delineation feature 302 perpendicular to the grooves 304a & 304b. This is usually in a single operation (as shown in FIG. 1a).

Cascaded groove structured surfaces address some of the problems associated with standard planar sandwich constructed devices, however these cascaded groove structured surfaces of the prior art are either interdigitated (parallel connected) or cascaded (series connected). The optoelectronic device 301 provides a mixture of interdigitated and cascaded groove structures. This allows the operating voltage of the optoelectronic device 301 to be designed and controlled by the number of series of grooves, for example 304a & 304b. Any number of series of grooves, for example 304a & 304b, can be produced and operated in parallel to provide the desired voltage output and series to provide the desired current output. The number of grooves affects the voltage and the number of series of grooves affects the current.

A conventional post off-axis directional coating demetallisation technique requires significant space to be set aside between a series of cascaded groove structures so that two properties can be maintained. The first property is a physical one in that there must be sufficient space to accommodate the delineation feature between the series of cascaded groove structures and also sufficient space to allow for registration tolerances of the technique chosen for the demetallisation technique, which may be, for example, a laser technique. The second property is that the space left after the post off-axis directional coating demetallisation process still needs to be capable of passing current of sufficient conductance to allow efficient use of the cascaded devices.

When a post off-axis directional coating demetallisation technique is used, the delineation feature or region between the series of cascaded grooves could be formed, for example, by laser cutting through the deposited conductor material whilst avoiding cutting through the supporting substrate or by the printing of metal etching material onto the deposited metals. Following the use of these techniques, the resulting delineation feature prevents the short circuiting of the positive output of one series of cascaded grooves with the negative output of the next series of cascaded grooves and prevents the lateral conduction from the individual cascaded grooves to the edge contacts.

The space required for the delineation feature to be introduced after the off-axis directional coating metallisation is relatively large and has no active function. Therefore, there is a reduction in active cascaded groove area since the delineation feature and the resulting charge extraction areas must be large enough to both allow the registration of the delineation feature with its associated tolerances and provide a low enough resistance pathway so that charge can be extracted without excessive internal losses. Consequently, for a solar photovoltaic cell, this region reduces the active area of the overall roll-to-roll fabricated product.

The optoelectronic device 301 increases the speed of, and decreases the cost of, manufacture of devices such as solar photovoltaic cells, with a concomitant increase in product yield due to reduced wastage during the manufacturing process.

Figure 3:
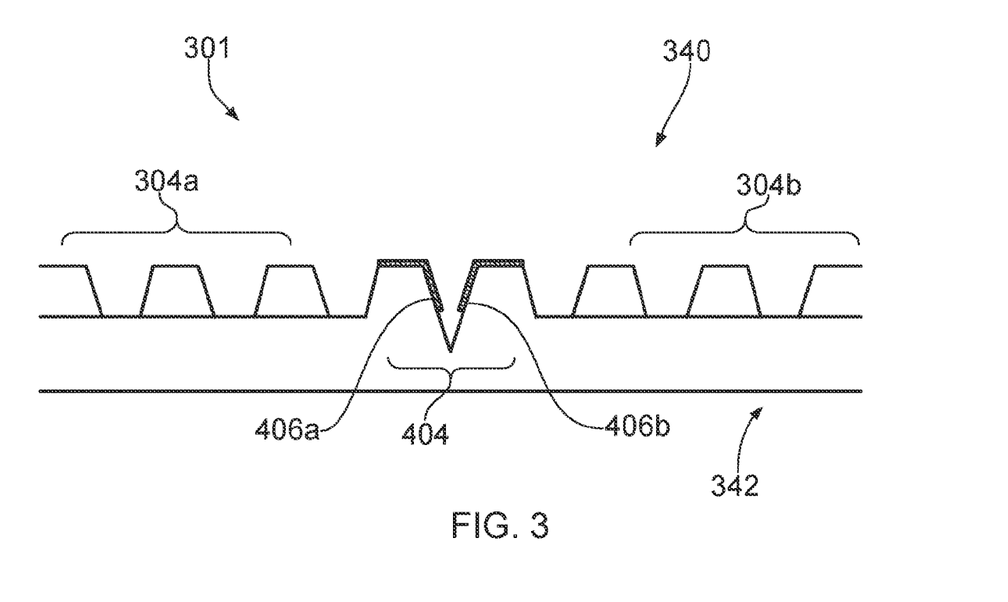
FIG. 3 is a cross-sectional view of an alternative design of the optoelectronic device of the present invention.

FIG. 3 shows a cross-sectional view of an alternative design of the optoelectronic device 301. The optoelectronic device 301 has a structured surface 340 and a flat surface 342. The first 304a and second 304b series of cascaded groove structures lie either side of the delineation feature 404. The charge extraction conductors 406a & 406b in combination with the delineation feature 404 are relatively compact and reduce the overall width on the surface of the substrate that is required compared to other known flat substrates. The delineation feature 404 represents an inactive area of the optoelectronic device 301, and therefore the smaller the inactive area the better.

The inactive area is shown here as a flat area between the grooves, 304a for example, and the delineation feature 404. The size of the inactive area may however be further reduced and as such be a peak between the grooves, for example 304a and the delineation feature 404.

Off-axis directional coating is used to fabricate the delineation feature 404, in particular off-axis directional coating is used to apply the conductor materials, the charge extraction conductors 406a & 406b to the upper surfaces of and adjacent to the delineation feature 404.

The delineation feature 404 is substantially perpendicular to the plane of the substrate and therefore reduces the area and or region between the grooves 304a & 304b, also referred to as active cascades, and therefore increases the effective active area of the substrate. The structural delineation feature 404 is created at the point of or before the step of off-axis directional coating and thereby reduces the width of the inactive area by over 50%, compared to when a delineation feature is introduced after, also referred to as post, off-axis directional coating demetallisation.

Charge extraction can be accomplished through the delineation feature 404 and as the delineation feature embodied in the present invention is vertically orientated or substantially vertically orientated, the amount of area needed to support enough conductive material 406a & 406b required for efficient charge extraction is reduced. Therefore, the inactive area introduced by a post off-axis directional coating demetallisation technique is significantly reduced in size when the creation of the delineation feature is combined with the off-axis directional coating process.

The solar photovoltaic cell 301 the present invention enables the positive and negative voltages produced across each series of cascaded grooves 304a & 304b to be connected in parallel, a process that is required to be able to extract the desired charge generated, at the voltage designed by the number of cascaded groove structures. This advantageously removes the need for extra process steps to be used to connect the cascaded groove structures in series to achieve the desired output voltage. The optoelectronic device of present invention helps to increase the speed of, and decrease the cost of manufacture of two terminal devices such as solar photovoltaic cells, with a concomitant increase in product yield due to a lower amount of wastage during the manufacturing process.

Once fabricated the charge extraction conductors 406a & 406b of the delineation feature 404 form input and output connections to the semiconductor material (not shown) in the cavities of the cascaded groove structures 304a & 304b.

Advantageously, this allows any length of web or solar photovoltaic cell 301 to be cut, whilst having the positive and negative outputs available at the opposite edges of the web.

Figure 4:
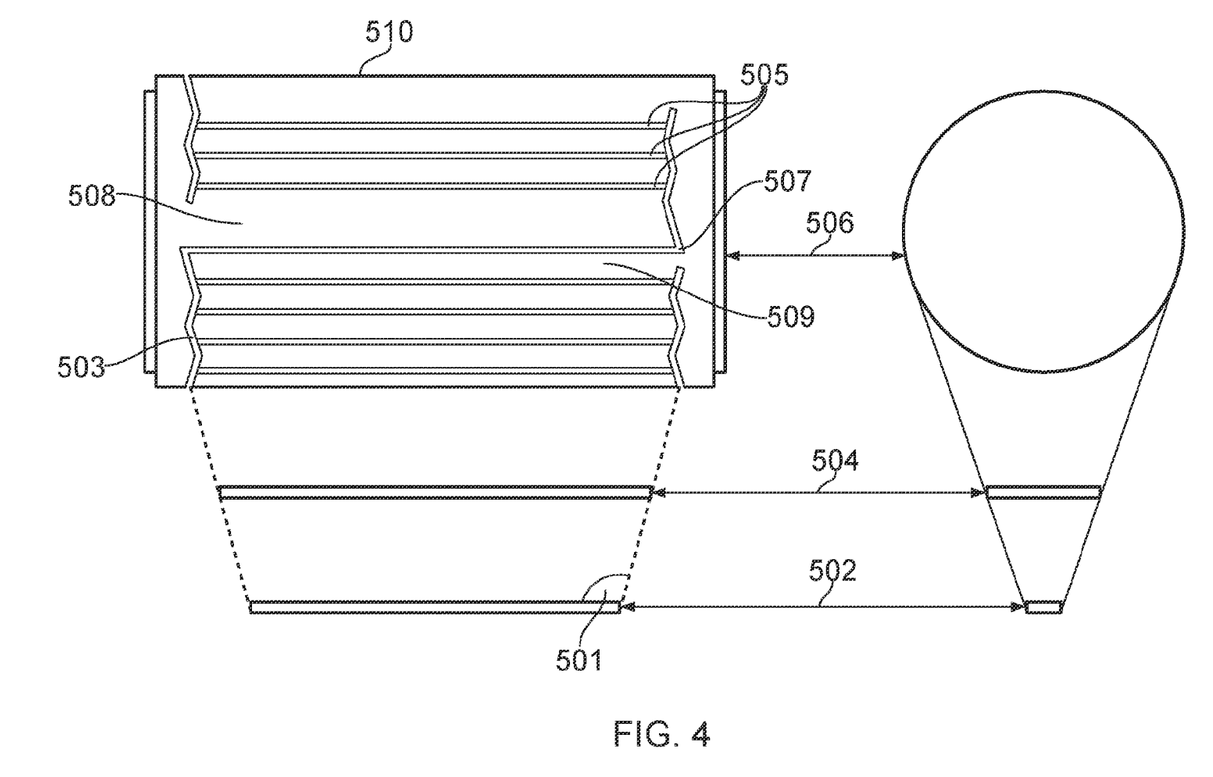
FIG. 4 is a plan and cross-sectional view of a roll-to-roll system used to produce the optoelectronic device of the present invention.

FIG. 4 shows a plan and cross-sectional view of a roll-to-roll system used to produce the optoelectronic device of the present invention.

Figure 5:
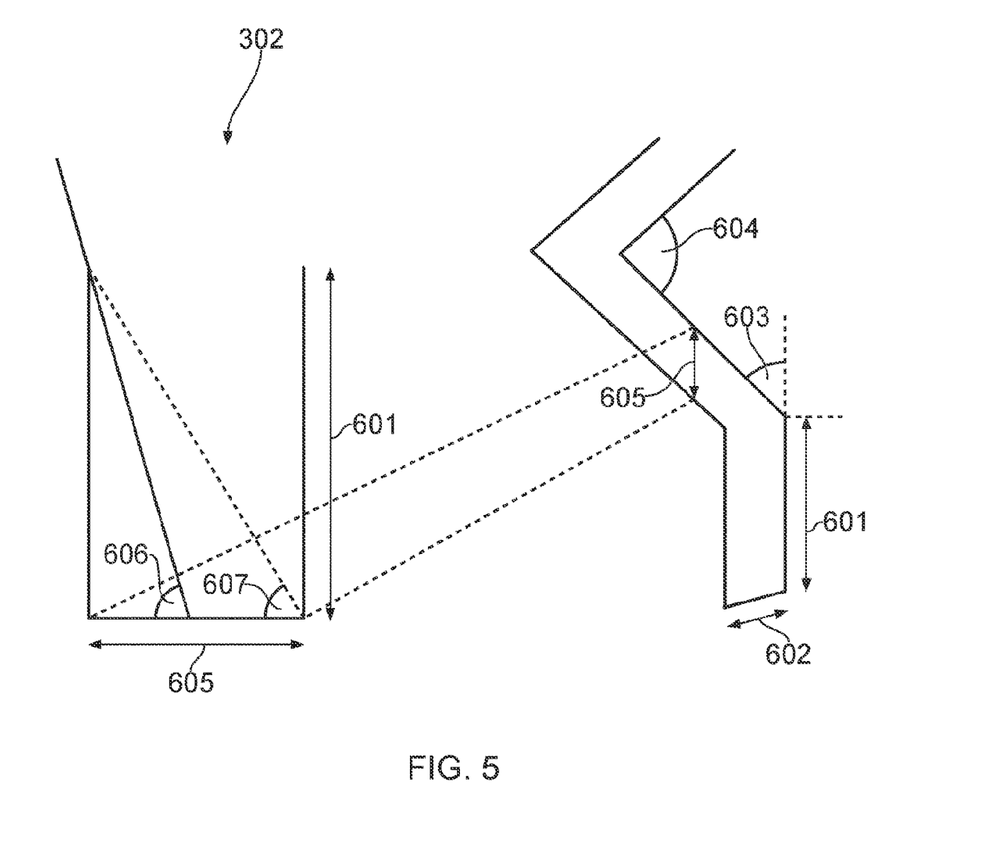
FIG. 5 is a cross-sectional view of the channel of the optoelectronic device of the present invention.

The angle 501 is the viewing angle of source 502 to delineation feature 503 at the closest approach wherein the largest possible angle is presented. Angle 501 corresponds to the angle 607 in FIG. 5. Angle 607 in FIG. 5 is the maximum interaction angle that will maintain coating separation on both faces of the delineation feature.

Shield 504 restricts coating on cascaded groove structures 505 and delineation feature 503 in such a way that the geometrical considerations of both 505 and 503 can be satisfied as they are presented in all of the positions of the roll as it passes around the drum 506. Any number of shields 504 may be used, including one, two, three, four through to a plurality of shields. This enables the selective coating technology deployed to create the charge extraction conductors 508 and 509 (shown as 406a & 406b in FIG. 3 and 306a & 306b in FIG. 2) of the delineation feature 507 at the same time as the off-axis directional coating of the grooves 505 (labelled 304a & 304b in FIGS. 2 and 3). Region 507 of the delineation feature is the specific region as it crosses across the web 510 and separates the two conductors 508 and 509.

The compound pattern of multiple series of cascaded grooves 505 and the relative large scale structural delineation feature 503 can be produced on a single drum 506, or two separate drum patterns may be deployed, one for the multiple series of cascaded grooves and one for the large scale structural delineation feature. Therefore, the second pattern, namely the delineation feature may be included either before or during the creation of the cascaded groove pattern in the patterning stage that produces the structured surface of multiple series of cascaded grooves.

The resulting pattern of a series of cascaded grooves and delineation features is such that it has orientated surfaces and when coating these surfaces from an angle, namely off-axis, conductor and/or semiconductor materials can be deposited on either side of the pattern as long as the structure onto which they are being coated and the relative positions of the sources meet the necessary geometrical requirements. These requirements are that the coating is substantially restricted by viewing angle to only one side or facet or face of the surface structure. Therefore, the end result of the off-axis directional coating is that there is no or little electrical conduction between any two opposing surfaces of the delineation feature. There may be some electrical conduction between any two opposing surfaces of or across the delineation feature but this is minimal and the disadvantageous parasitic effect of this electrical conduction across the delineation feature can be factored into the design of the optoelectronic device.

Creating the delineation feature 507 at the time of surface structuring, which is before off-axis directional coating, as opposed to post off-axis directional coating by a known demetallisation technique such as a laser or metal etching, means that the stringent requirements for tolerance of laser registration are mitigated, and the overall width of the delineation feature is reduced, thus minimising the size of the inactive region.

The inactive area produced using the method of the present invention is less than 50% of the inactive area produced by known post off-axis directional coating demetallisation techniques. There is therefore an increase in product yield due to a lower amount of wastage during the manufacturing process of the present invention.

FIG. 5 shows a cross-sectional view of the channel 302 of the optoelectronic device 301 shown in FIG. 1a.

The vertical height 601, the horizontal width 602, the starting angle 603, the turning angle 604 and effective width 605 of the single delineation feature 302 in the direction of the roll are all shown in FIG. 5.

The angle 606 at the base of an assumed square sided structure defines the angle at which half of the delineation feature 302 will be coated with material arriving at that angle. The angle 607 at the bottom of the delineation feature 302 is the angle at which only one vertical side is coated.

These criteria are based upon the aspect ratios of the delineation feature 301 and angles 603 and 604. The geometrical relationships between these angles and the aspect ratio can be used to calculate the width 605 of the delineation feature and thus at the turn in the feature at angle 604, this length is doubled and therefore the critical angle shown as 607 is the maximum angle that can be allowed to occur.

For the purposes of exemplification, it is possible for angle 603 to equal zero degrees, in which scenario, the delineation feature 301 would run both parallel and perpendicular to the surface being coated. There may be a greater possibility of electrical connection when the delineation feature 301 runs perpendicular.

For an efficient use of material, it has been found that an angle 603 of 45 degrees is useful. When this angle is coupled with an aspect ratio of 2:1 for the height 601 to the width 605 of the delineation feature, it has been shown that there are excellent yields with thicknesses of coatings being comparable to those required for commercially useful devices.

For critical angle 607, a greater sized angle is desirable in order to produce good separation of the coated faces. Critical angle 607 is defined by the following equation:

$$\angle 607 = \tan^{-1}\left(\left(\frac{601}{602}\right)\sin \angle 603\right) + 5°$$

In which $\angle 607$ is the critical angle 607, 601 is the vertical height of the delineation feature, 602 is the horizontal width of the delineation feature, and $\angle 603$ is the starting angle of the delineation feature, as defined above. In an embodiment, an angle of 5 degrees is added to the result of the inverse tangent operation as a safety factor. Depending upon the application however, this safety factor could, in alternative embodiments, be larger or smaller.

Thus, and for further purposes of exemplification, with an aspect ratio of 1:1 for the height to width of the delineation feature, when angle 603 equals 75 degrees, angle 607 equals 44 degrees and when angle 603 equals 15 degrees, angle 607 equals 14 degrees. With an aspect ratio of 2:1 for the height to width of the delineation feature, when angle 603 equals 15 degrees, angle 607 equals 62 degrees and when angle 603 equals 75 degrees, angle 607 equals 27 degrees. With an aspect ratio of 3:1 for the height to width of the delineation feature, when angle 603 equals 75 degrees, angle 607 equals 37 degrees. With an aspect ratio of 4:1 for the height to width of the delineation feature, when angle 603 equals 75 degrees, angle 607 equals 45 degrees. The angles calculated above assume the flat or planar surface of the substrate represents zero degrees.

Modifications and improvements can be incorporated herein without departing from the scope of the invention.

The invention claimed is:

1. An optoelectronic device comprising:
a substrate comprising a first series of grooves and a second series of grooves and a channel therebetween;
each groove of the first series of grooves and the second series of grooves having a first face and a second face and a cavity therebetween;
the cavity at least partially filled with a first semiconductor material;
the first face coated with a conductor material and the second face coated with a second semiconductor material;
wherein the channel comprises a first channel face coated with the conductor material and a second channel face coated with the second semiconductor material, wherein the first channel face and the second channel face define a channel cavity that is at least partially filled with the first semiconductor material;
wherein the channel also transects the grooves of the first series of grooves and the second series of grooves; and
wherein a portion of the first series of grooves and the second series of grooves and a portion of the channel therebetween are substantially parallel to one another; and
wherein there is no electrical communication between the first semiconductor material in the channel cavity, second semiconductor material on the second channel face, and the conductor material on the first channel face.

2. The optoelectronic device as claimed in claim 1, wherein the channel transects the grooves of the first series of grooves toward an end of each groove and then passes between the first series of grooves and the second series of grooves, transecting the grooves of the second series of grooves toward an opposite end of each groove.

3. The optoelectronic device as claimed in claim 1, wherein the first face and the second face of each of the grooves of the first series of grooves and the second series of grooves are coated with the conductor material.

4. The optoelectronic device as claimed in claim 1, wherein the first semiconductor material is a p-type semiconductor material and the second semiconductor material is an n-type semiconductor material.

5. The optoelectronic device as claimed in claim 1, wherein the first semiconductor material and the second semiconductor material are together referred to as an active material, the active material deposited in the cavity and on the first face and/or the second face of the cavity to provide ohmic and rectifying contacts for insertion or extraction of charge from the active material.

6. The optoelectronic device as claimed in claim 1, wherein the angle at which the channel transects the ends of the first series of grooves and the second series of grooves is variable and from greater than 0 to 90°.

7. The optoelectronic device as claimed in claim 1, wherein the first semiconductor material in the cavity, second semiconductor material on the second face and conductor material on at least the first face of each groove of the first series of grooves and the second series of grooves are independently all in electrical communication.

8. The optoelectronic device as claimed in claim 1, wherein the first channel face and the second channel face are coated with the conductor material.

9. The optoelectronic device as claimed in claim 8, wherein a first side and a second side of the channel provide the positive and negative poles of an electrical circuit, the first side and the second side being in electrical communication with the conductor material on the first channel face and the second channel face.

10. The optoelectronic device as claimed in claim 1, wherein the cavity between the first face and the second face of the first series of grooves and the second series of grooves is U-shaped, V-shaped or semi-spherical.

11. The optoelectronic device as claimed in claim 1, wherein the cavity between the first face and the second face of the first series of grooves and the second series of grooves has a flat bottom.

12. The optoelectronic device as claimed in claim 8, wherein the channel cavity between the first channel face and the second channel face is U-shaped, V- shaped or semi-spherical.

13. The optoelectronic device as claimed in claim 8, wherein the channel cavity between the first channel face and the second channel face has a flat bottom.

14. The optoelectronic device as claimed in claim 8, wherein the channel cavity between the first channel face and the second channel face has a rutted bottom.

15. The optoelectronic device as claimed in claim 1, wherein the depth of the channel is at least twice the depth of the grooves of the first series of grooves and the second series of grooves.

16. The optoelectronic device as claimed in claim 1, wherein the depth of the channel is twice the width of the channel.

17. An optoelectronic device comprising:
a substrate comprising a first series of grooves and a second series of grooves and a channel therebetween;
each groove of the first series of grooves and the second series of grooves having a first face and a second face and a cavity therebetween;
the cavity at least partially filled with a first semiconductor material;
the first face coated with a conductor material and the second face coated with a second semiconductor material;
wherein the channel also transects the grooves of the first series of grooves and the second series of grooves; and
wherein a portion of the first series of grooves and the second series of grooves and a portion of the channel therebetween are substantially parallel to one another; and
wherein the channel comprises:
a first channel face coated with the conductor material;
a second channel face coated with the second semiconductor material;
wherein the first channel face and the second channel face define a channel cavity that is at least partially filled with the first semiconductor material; and
wherein a first side and a second side of the channel provide respective positive and negative poles of an electrical circuit, the first side and the second side being in electrical communication with the conductor material on the first channel face and the second channel face; and
wherein each groove extends between opposite ends that terminate at a respective one of the positive and negative poles.

* * * * *